United States Patent
Chiu et al.

(10) Patent No.: US 10,326,062 B2
(45) Date of Patent: Jun. 18, 2019

(54) UV LED PACKAGE STRUCTURE, UV LIGHT EMITTING UNIT, AND METHOD FOR MANUFACTURING UV LIGHT EMITTING UNIT

(71) Applicants: LITE-ON OPTO TECHNOLOGY (CHANGZHOU) CO., LTD., Changzhou, Jiangsu (CN); LITE-ON TECHNOLOGY CORPORATION, Taipei (TW)

(72) Inventors: Kuo-Ming Chiu, New Taipei (TW); Han-Hsing Peng, New Taipei (TW); Meng-Sung Chou, New Taipei (TW)

(73) Assignees: LITE-ON OPTO TECHNOLOGY (CHANGZHOU) CO., LTD., Changzhou, Jiangsu Province (CN); LITE-ON TECHNOLOGY CORPORATION, Taipei (TW)

( * ) Notice: Subject to any disclaimer, the term of this patent is extended or adjusted under 35 U.S.C. 154(b) by 0 days.

(21) Appl. No.: 15/862,481

(22) Filed: Jan. 4, 2018

(65) Prior Publication Data
US 2018/0315907 A1 Nov. 1, 2018

(30) Foreign Application Priority Data
Apr. 28, 2017 (CN) .......................... 2017 1 0293884

(51) Int. Cl.
*H01L 33/48* (2010.01)
*H01L 33/58* (2010.01)
*H01L 33/56* (2010.01)
*H01L 33/62* (2010.01)
*H01L 33/32* (2010.01)
*H01L 33/60* (2010.01)

(52) U.S. Cl.
CPC .............. *H01L 33/58* (2013.01); *H01L 33/32* (2013.01); *H01L 33/486* (2013.01); *H01L 33/56* (2013.01); *H01L 33/60* (2013.01); *H01L 33/62* (2013.01); *H01L 2933/005* (2013.01); *H01L 2933/0033* (2013.01); *H01L 2933/0058* (2013.01)

(58) Field of Classification Search
CPC .............................. H01L 33/486; H01L 33/58
See application file for complete search history.

(56) References Cited

U.S. PATENT DOCUMENTS

2007/0267645 A1* 11/2007 Nakata .................... H01L 33/58
257/98

* cited by examiner

*Primary Examiner* — Daniel P Shook
(74) *Attorney, Agent, or Firm* — Li & Cai Intellectual Property (USA) Office

(57) ABSTRACT

A UV light-emitting unit includes a carrier, a UV LED chip, a side lens, and a water-resistant layer. The UV LED chip is disposed on the carrier, and the UV LED chip has a top surface and a surrounding side surface arranged adjacent to the top surface. The top surface has a center region and an external region arranged around the center region and connected to the surrounding side surface. The side lens is disposed on the carrier. The surrounding side surface of the UV LED chip is covered by the side lens. The water-resistant layer covers an outer surface of the side lens and the external region of the top surface of the UV LED chip. In addition, the present disclosure also discloses a UV LED package structure and a method for manufacturing a UV light-emitting unit.

17 Claims, 16 Drawing Sheets

UV LED PACKAGE STRUCTURE, UV LIGHT EMITTING UNIT, AND METHOD FOR MANUFACTURING UV LIGHT EMITTING UNIT

BACKGROUND OF THE INVENTION

1. Field of the Invention

The present disclosure relates to a light emitting unit; in particular, to a UV LED package structure, a UV light emitting unit, and a method for manufacturing a UV light emitting unit.

2. Description of Related Art

A conventional UV LED package structure including a UV LED chip provides with low light efficiency and bad reliability. Therefore, a major topic in the UV LED package structure is how to improve the light efficiency and bad reliability for the conventional UV LED package structure.

SUMMARY OF THE INVENTION

The present disclosure provides a UV LED package structure, a UV light emitting unit, and a method for manufacturing a UV light emitting unit to solve the drawbacks associated with conventional UV LED package structure.

The UV LED package structure, the UV light emitting unit, and the method for manufacturing a UV light emitting unit in the present disclosure each adapts the side lens, so that the light efficiency of the UV light emitting unit can be effectively increased. Moreover, the water-resistant layer is formed on the outer surface of the side lens, thereby effectively preventing any steam from invading into the UV LED chip to increase the reliability of the UV light emitting unit.

In order to further appreciate the characteristics and technical contents of the present disclosure, references are hereunder made to the detailed descriptions and appended drawings in connection with the present disclosure. However, the appended drawings are merely shown for exemplary purposes, and should not be construed as restricting the scope of the present disclosure.

DETAILED DESCRIPTION OF THE PREFERRED EMBODIMENTS

References are hereunder made to the detailed descriptions and appended drawings in connection with the present disclosure. However, the appended drawings are merely provided for exemplary purposes, and should not be construed as restricting the scope of the present disclosure.

First Embodiment

Reference is made to FIGS. 1 to 10, which illustrate a first embodiment of the present disclosure. The present embodiment discloses a UV light emitting unit 100 and a method for manufacturing the UV light emitting unit 100. The following description discloses the method first in order to clearly describe the UV light emitting unit 100, but the UV light emitting unit 100 is not limited to being produced by the method. As shown in FIGS. 1 to 4, the method of the present embodiment includes steps S110 to S170. However, the steps S110 to S170 can be changed or replaced in a reasonable manner, and the sequence of the steps S110 to S170 can be adjusted according to practical needs. Moreover, the figures only show how to manufacture two UV light emitting units 100 in order to clearly illustrate the method.

Figure 1:
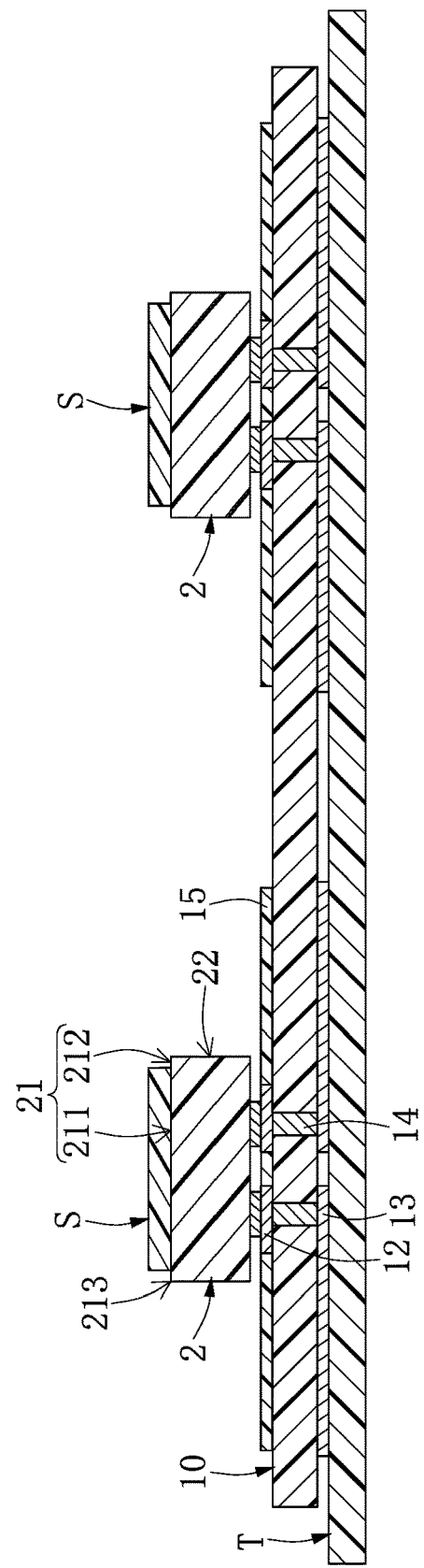
FIG. 1 is a cross-sectional view showing steps S110 to S130 of a method for manufacturing a UV light emitting unit according to a first embodiment of the present disclosure.

As shown in FIG. 1, the step S110 is implemented by mounting a plurality of UV LED chips 2 on a circuit board 10, which has a substantially plate-like structure. The UV LED chip 2 has a top surface 21 and a surrounding side surface 22 arranged adjacent to the top surface 21. In the present embodiment, the top surface 21 is a light emitting surface of the UV LED chip 2, and the surrounding side surface 22 is connected to a peripheral edge 213 of the top surface 21. Moreover, the top surface 21 has a central region 211 and an external region 212, the latter one of which is arranged around the central region 211 and is connected to the surrounding side surface 22. The shape and the size of the central region 211 can be changed according to practical needs, and the present disclosure is not limited thereto. For example, the central region 211 can be a square shape, and an area of the central region 211 can be larger than that of the external region 212.

As shown in FIG. 1, the step S120 is implemented by attaching a protective sheet S onto the central region 211 of the top surface 21 of each of the UV LED chips 2. The central region 211 of the UV LED chip 2 is entirely covered by the protective sheet S. The protective sheet S can be a thermal degradation tape, a heat resistance tape, or a UV-off tape, but the present disclosure is not limited thereto.

As shown in FIG. 1, the step S130 is implemented by attaching the circuit board 10 onto a releasing tape T. The releasing tape T in the present embodiment can be a thermal release tape, a heat-resistant tape, or a UV tape, and the material of the releasing tape T is preferably as the same as that of the protective sheet S (for example, the releasing tape T and the protective sheet S are UV tapes), but the present disclosure is not limited thereto.

Figure 2:
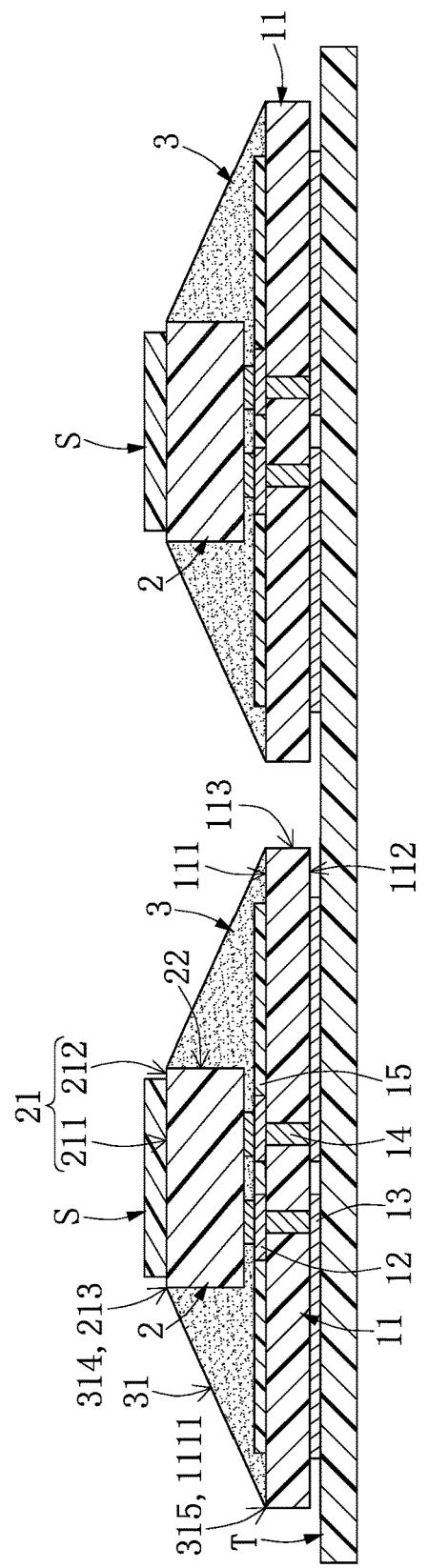
FIG. 2 is a cross-sectional view showing steps S140 and S150 of the method according to the first embodiment of the present disclosure.

As shown in FIG. 2, the step S140 is implemented by sawing the circuit board 10 to form a plurality of carriers 11 each having a first surface 111 and an opposite second surface 112, a plurality of electrode layers 12 respectively formed on the first surfaces 111 of the carriers 11, a plurality of soldering layers 13 respectively formed on the second surfaces 112 of the carriers 11, a plurality of conductive pillars 14 respectively embedded in the carriers 11, and a plurality of reflective layers 15 arranged on the first surface 111 of the carrier 11. Moreover, each of the carriers 11 and the corresponding components are provided with one of the UV LED chips 2 disposed on the corresponding electrode layer 12, and the corresponding reflective layer 15 is arranged around the electrode layer 12. The carrier 11 further has a peripheral side 113 connected to the first surface 111 and the second surface 112. Two opposite ends of each of the conductive pillars 14 are respectively connected to the electrode layer 12 and the soldering layer 13, thereby establishing an electrical connection between the electrode layer 12 and the soldering layer 13. The UV LED chip 2 is electrically connected to the electrode layer 12 and the soldering layer 13.

As shown in FIG. 2, the step S150 is implemented by forming a side lens 3 on each of the carriers 11 to cover the surrounding side surface 22 of the corresponding UV LED chip 2. The side lens 3 is made of fluoropolymer or PDMS, and the reflective layer 15 is embedded in the side lens 3. A bottom edge 315 of an outer surface 31 of the side lens 3 is preferably connected to a peripheral edge 1111 of the carrier 11. A top edge 314 of the outer surface 31 of the side lens 3 is preferably connected to a peripheral edge 213 of the top surface 21 of the UV LED chip 2, but present disclosure is not limited thereto.

Figure 3:
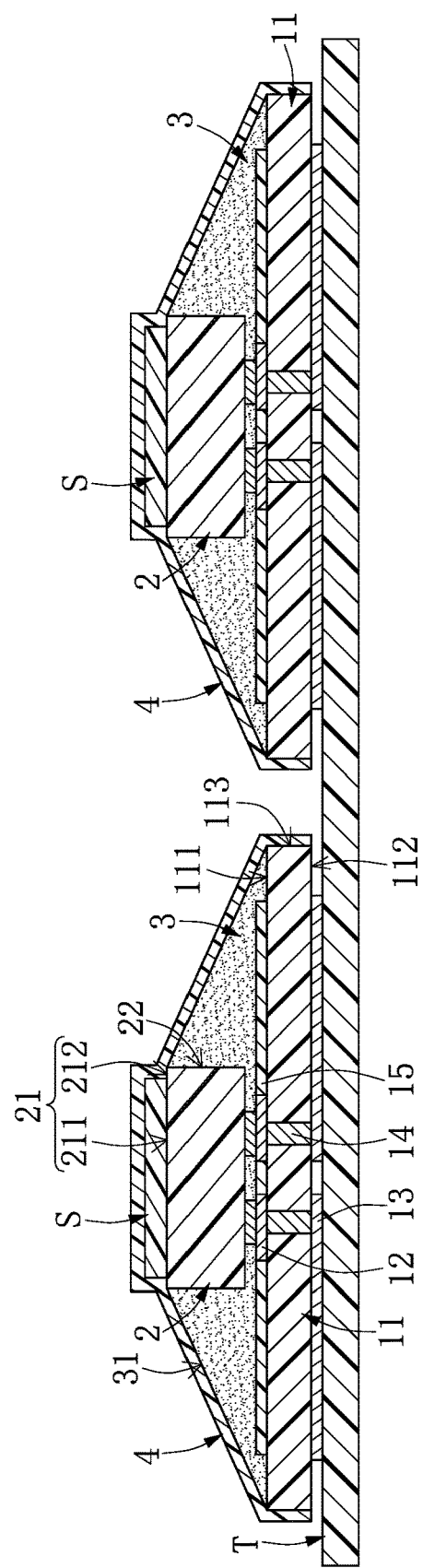
FIG. 3 is a cross-sectional view showing step S160 of the method according to the first embodiment of the present disclosure.

As shown in FIG. 3, the step S160 is implemented by forming a water-resistant layer 4 on each of the side lenses 3 to cover the peripheral side 113 of the corresponding carrier 11, the outer surface 31 of the corresponding side lens 3, the external region 212 of the top surface 21 of the corresponding UV LED chip 2, and the corresponding protective sheet S. Specifically, a UV light emitting unit 100 formed by the carrier 11, the UV LED chip 2, the protective sheet S, and the side lens 3 in the present embodiment is substantially embedded in the water-resistant layer 4. In other words, the UV light emitting unit 100 is almost embedded in the water-resistant layer 4 excepting the bottom surface 112 of the carrier 11, but the present disclosure is not limited thereto.

Figure 4:
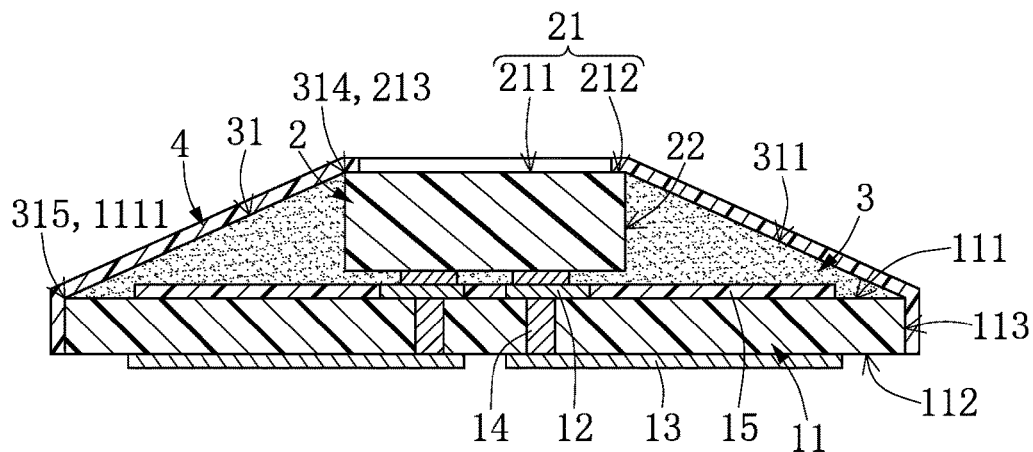
FIG. 4 is a cross-sectional view showing step S170 of the method according to the first embodiment of the present disclosure.

As shown in FIG. 4, the step S170 is implemented by removing the protective sheets S and the releasing tape T, thereby forming a plurality of UV light emitting units 100. Before the protective sheets S and the releasing tape T are removed, the protective sheets S and the releasing tape T can be heated, irradiated by UV light, or contacted with an organic solution (e.g., acetone, ethanone, or isopropanol) according to their material for reducing the adhesion of each of the protective sheets S and the releasing tape T with respect to the UV light emitting units 100, so that the protective sheets S and the releasing tape T can be removed from the UV light emitting units 100 more easily.

Figure 5:
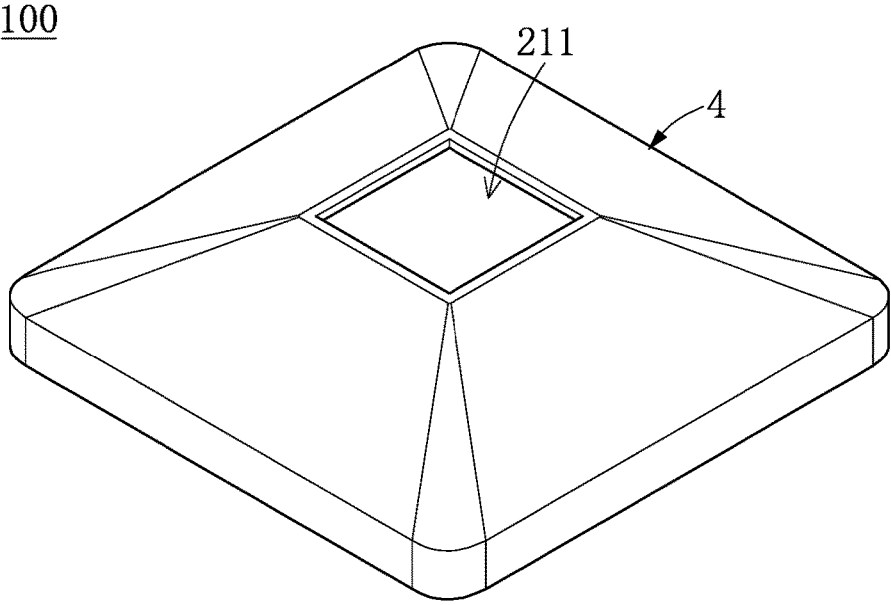
FIG. 5 is a perspective view showing the UV light emitting unit according to the first embodiment of the present disclosure.
Figure 6:
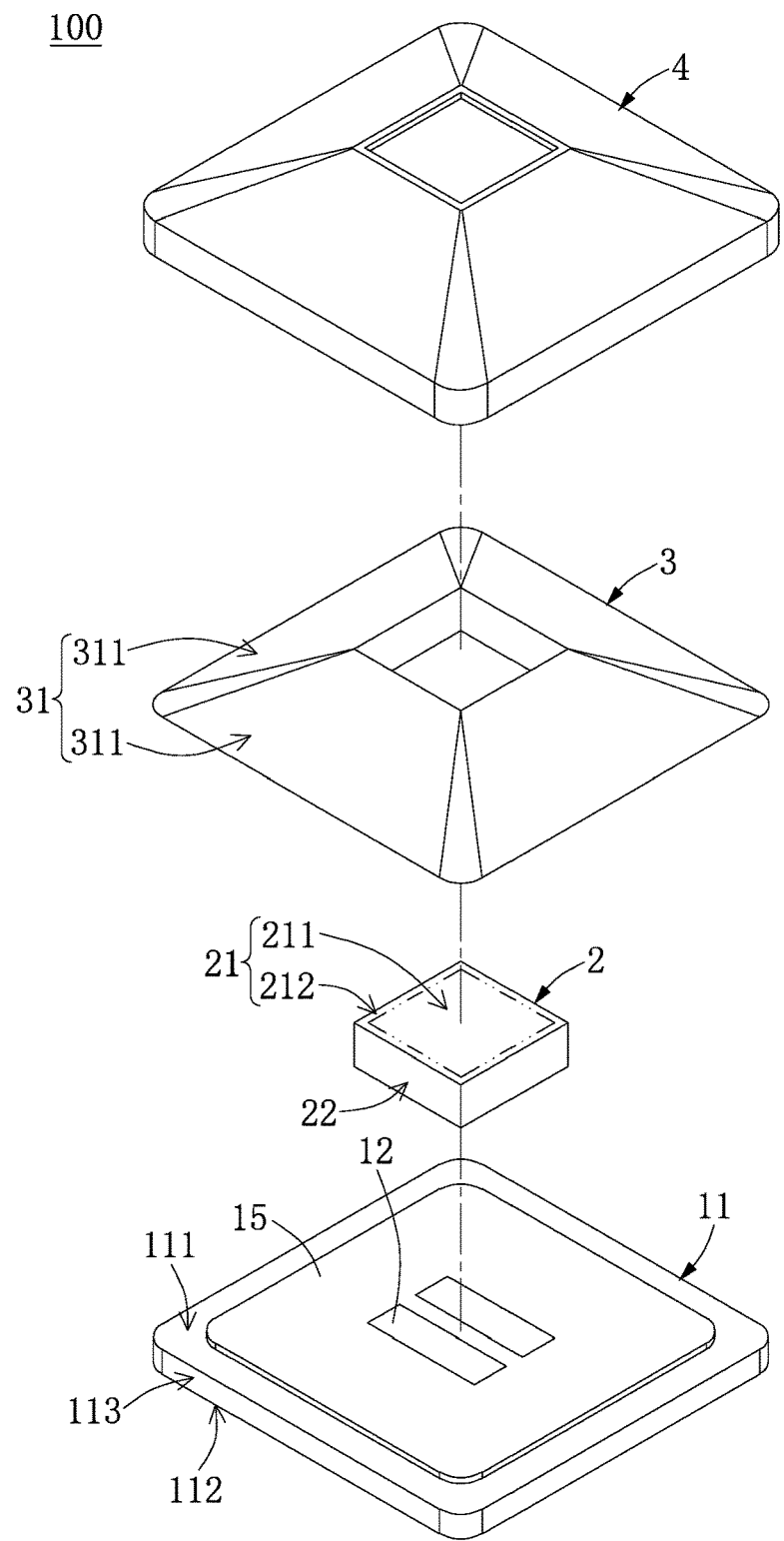
FIG. 6 is an exploded view of FIG. 5.

The method in the present embodiment has been disclosed in the above description, and the following description discloses the structure of the UV light emitting unit 100. As shown in FIGS. 4 to 6, the UV light emitting unit 100 includes a carrier 11, a UV LED chip 2, a side lens 3, and a water-resistant layer 4. The following description discloses the structure and connection relationships of each component of the UV light emitting unit 100.

The UV light emitting unit 100 further includes an electrode layer 12, a soldering layer 13, a plurality of conductive pillars 14, and a reflective layer 15. The carrier 11 has a first surface 111 and a second surface 112 opposite to the first surface 111. The electrode layer 12 is arranged on the first surface 111. The soldering layer 13 is arranged on the second surface 112. The conductive pillars 13 are embedded in the carrier 11, and two opposite ends of each of the conductive pillars 13 are respectively connected to the electrode layer 12 and the soldering layer 13, thereby establishing an electrical connection between the electrode layer 12 and the soldering layer 13. The reflective layer 15 is arranged on the first surface 111 of the carrier 11 and around the electrode layer 12. The reflective layer 15 and the electrode layer 12 are complementary in shape with each other to form a sheet-like structure, but the present disclosure is not limited thereto. Moreover, the reflective layer 15 is also around (two electrode pads of) the UV LED chip 2.

Specifically, the reflective layer 15 in the present embodiment can be made of aluminum nitride, gold, or aluminum, but the present disclosure is not limited thereto. For example, when the reflective layer 15 is made of aluminum, the light reflectivity of the reflective layer 15 with respect to UV light of 280 nm is 92%, so that the reflective layer 15 can be used to increase the light efficiency of the UV LED chip 2 (i.e., +27%). It should be noted that the reflective layer 15 made of aluminum is preferably covered by magnesium fluoride or silicon dioxide so as to prevent oxidation. Moreover, when the reflective layer 15 is made of gold, the light reflectivity of the reflective layer 15 with respect to UV light of 280 nm is 38%, so that the reflective layer 15 can be used to increase the light efficiency of the UV LED chip 2 (i.e., +13.5%). When the reflective layer 15 is made of aluminum nitride, the light reflectivity of the reflective layer 15 with respect to UV light of 280 nm is 16%.

The UV LED chip 2 in the present embodiment includes a plurality of quantum wells (i.e., $Al_xGa_{1-x}N$ films, and $x>0.2$) disposed on a sapphire substrate thereof. The UV LED chip 2 is configured to emit light of a wavelength less than 324 nm, and the UV LED chip 2 is configured to have a bat-wing shaped light pattern and have a light emitting angle of substantial 126.5 degrees, but the present disclosure is not limited thereto. It should be noted that the UV light emitting unit 100 of the present disclosure must use a UV LED chip, that is to say, any light emitting unit, which is not included a UV LED chip, is not the subject in the present disclosure.

Specifically, the UV LED chip 2 has a top surface 21 and a surrounding side surface 22. In the present embodiment, the top surface 21 is a light emitting surface of the UV LED chip 2, and the surrounding side surface 22 is connected to a peripheral edge 213 of the top surface 21. Moreover, the top surface 21 has a central region 211 and an external region 212, the latter one of which is arranged around the central region 211 and is connected to the surrounding side surface 22. The shape and the size of the central region 211 can be changed according to practical needs, and the present disclosure is not limited thereto. For example, the central region 211 can be a square shape, and an area of the central region 211 can be larger than that of the external region 212.

Moreover, the UV LED chip 2 is a flip chip and includes two electrode pads (not labeled) arranged on a bottom surface thereof, and the two electrode pads in the present embodiment are substantially arranged under the central region 211 of the top surface 21. That is to say, the position of the two electrode pads is arranged distant from the top surface 21, and a projecting region defined by orthogonally projecting the two electrode pads onto the top surface 21 is located in the central region 211, but the present disclosure is not limited thereto.

The two electrode pads of the UV LED chip 2 are bonded on the electrode layer 12, thereby establishing an electrical connection between the UV LED chip 2 and the electrode layer 12. A projecting region defined by orthogonally projecting the UV LED chip 2 onto the carrier 11 is substantially located on a center portion of the reflective layer 15, and the projecting region has an area less than half of an area of the reflective layer 15.

The side lens 3 is made of fluoropolymer or PDMS, and a reflective index of the side lens 3 in the present embodiment is substantially 1.4. The side lens 3 is disposed on the carrier 11, the surrounding side surface 22 of the UV LED 2 is entirely covered by the side lens 3, and the reflective layer 15 is embedded in the side lens 3. That is to say, a portion of the UV LED chip 2 exposed from the side lens 3 is only the top surface 21 of the UV LED chip 2.

The side lens 3 has an outer surface 31. A top edge 314 of the outer surface 31 is connected to the peripheral edge 213 of the top surface 21 (or the external region 212), and a bottom edge 315 of the outer surface 31 is connected to a peripheral edge 1111 of the first surface 111 of the carrier 11. Specifically, the side lens 3 is formed by respectively connecting the top edge 314 and the bottom edge 315 of the side lens 3 to the peripheral edge 213 of the top surface 21 and the peripheral edge 1111 of the first surface 111 of the carrier 11, so that the shape of the outer surface 31 of the side lens 3 (e.g., a flat surface 311, a concave surface 312, or a convex surface 313) can be adjusted to have a suitable surface tension according to designer's needs (e.g., light efficiency and light emitting angle). The following description discloses three different configurations of the UV light emitting units 100.

As shown in FIGS. 4 to 6, the outer surface 31 of the side lens 3 includes a plurality of flat surfaces 311. The top edges 314 of the flat surfaces 311 are connected to the peripheral edge 213 of the top surface 21 (or the external region 212) of the UV LED chip 2, and the bottom edges 315 of the flat surfaces 311 are connected to the peripheral edge 1111 of the carrier 11 (or the first surface 111). Thus, compared to a UV light emitting unit 100 formed without disposing the side lens 3, the light efficiency of the UV light emitting unit 100 as shown in FIGS. 4 to 6 can be effectively increased (i.e., about +23%~+27%), and the light emitting angle of the UV light emitting unit 100 can be substantially controlled in a range within 115~120 degrees.

Figure 7:
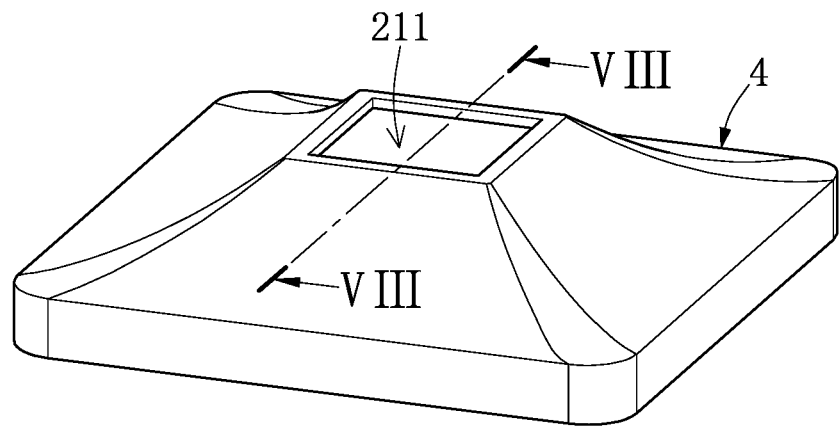
FIG. 7 is a perspective view showing the UV light emitting unit in another configuration according to the first embodiment of the present disclosure.
Figure 8:
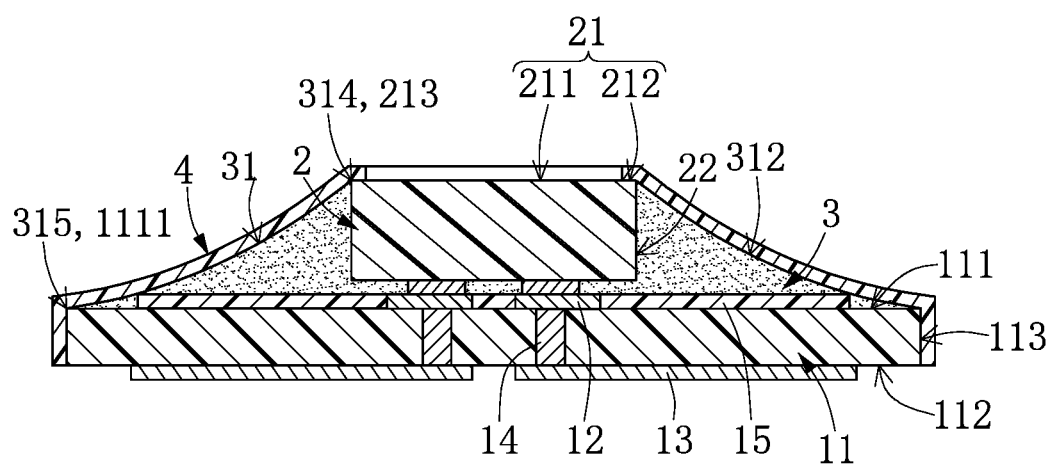
FIG. 8 is a cross-sectional view taken along a cross-sectional line of FIG. 7.

As shown in FIGS. 7 and 8, the outer surface 31 of the side lens 3 includes a plurality of concave surfaces 312. The top edges 314 of the concave surfaces 312 are connected to the peripheral edge 213 of the top surface 21 (or the external region 212) of the UV LED chip 2, and bottom edges 315 of the concave surfaces 312 are connected to the peripheral edge 1111 of the carrier 11 (or the first surface 111). Thus, compared to a UV light emitting unit 100 formed without the side lens 3, the light efficiency of the UV light emitting unit 100 as shown in FIGS. 7 and 8 can be effectively increased (i.e., about +17%~+23%), and the light emitting angle of the UV light emitting unit 100 can be substantially controlled at 100.9 degrees.

Figure 9:
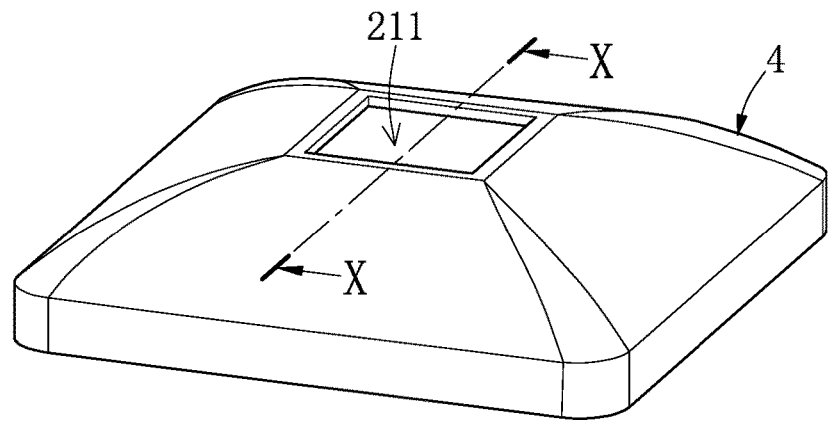
FIG. 9 is a perspective view showing the UV light emitting unit in still another configuration according to the first embodiment of the present disclosure.
Figure 10:
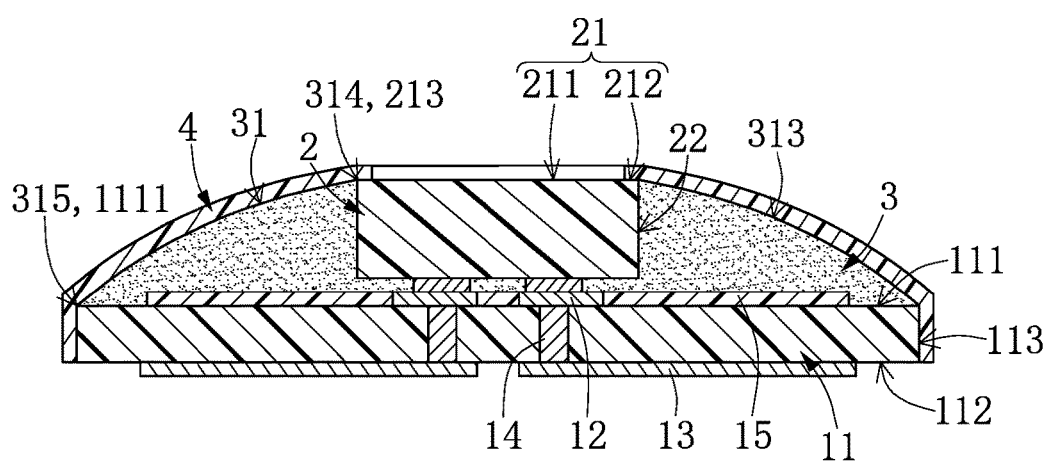
FIG. 10 is a cross-sectional view taken along a cross-sectional line X-X of FIG. 9.

As shown in FIGS. 9 and 10, the outer surface 31 of the side lens 3 includes a plurality of convex surfaces 313. The top edges 314 of the convex surfaces 313 are connected to the peripheral edge 213 of the top surface 21 (or the external region 212) of the UV LED chip 2, and the bottom edges 315 of the convex surfaces 313 are connected to the peripheral edge 1111 of the carrier 11 (or the first surface 111). Thus, compared to a UV light emitting unit 100 formed without disposing the side lens 3, the light efficiency of the UV light emitting unit 100 as shown in FIGS. 9 and 10 can be effectively increased (i.e., about +27%~+33%), and the light emitting angle of the UV light emitting unit 100 can be substantially controlled at 123.6 degrees.

Accordingly, the light efficiency of the UV light emitting unit 100 can be effectively increased by forming the side lens 3 made of fluoropolymer or PDMS. Moreover, the shape of the outer surface 31 of the side lens 3 can be adjusted according to designer's needs (e.g., light efficiency and light emitting angle), thereby satisfying different requests.

As shown in FIGS. 4 to 6, the water-resistant layer 4 is translucent and is made of fluoropolymer or an inorganic silicon dioxide film. In the present embodiment, the water-resistant layer 4 is made of amorphous fluoropolymer and substantially has a reflective index of 1.35, and the amorphous fluoropolymer preferably has a plurality of peripheral functional groups of —CONH~Si(OR)n, but the present disclosure is not limited thereto. The water-resistant layer 4 having —CONH~Si(OR)n is provided with a steam permeability of 0.2 g/m2/1 day. The side lens 3 made of PDMS is provided with a steam permeability of 105 g/m2/1 day. That is to say, the steam permeability of the water-resistant layer 4 is less than that of the side lens 3, and the steam permeability of the side lens 3 divided by that of the water-resistant layer 4 is more than 10 (for example, 10~500 is preferable).

The water-resistant layer 4 covers the outer surface 31 of the side lens 3 and the external region 212 of the top surface 21 of the UV LED chip 2. In the present embodiment, the water-resistant layer 4 further covers the peripheral side 113 of the carrier 11 (i.e., the side surfaces of the carrier 11 between the first surface 111 and the second surface 112), and the second surface 112 of the carrier 11 is exposed from the water-resistant layer 4, but the present disclosure is not limited thereto. In other words, the carrier 11, the UV LED chip 2, and the side lens 3 in the present embodiment are almost embedded in the water-resistant layer 4, but the central region 211 of the top surface 21 of the UV LED chip 2 and the second surface 112 of the carrier 11 are exposed from the water-resistant layer 4.

Accordingly, the UV light emitting unit 100 is provided with the water-resistant layer 4, which is made of fluoropolymer or an inorganic silicon dioxide film, to effectively prevent any steam from invading into the UV LED chip 2, so that the damage probability of the UV LED chip 2 can be reduced. Moreover, when the UV light emitting unit 100 is applied to a method for manufacturing a UV LED package structure 1000 in the present disclosure, any nitrogen or vacuum packaging apparatus does not need to be used because the UV light emitting unit 100 has the water-resistant layer 4, so that the cost of packaging machine can be effectively reduced.

Second Embodiment

Reference is made to FIGS. 11 to 15, which illustrate a second embodiment of the present disclosure. The present embodiment discloses a UV LED package structure 1000, which has the UV light emitting unit 100 disclosed in the first embodiment, and a method for manufacturing a UV LED package structure 1000. The description of the UV light emitting unit 100 and the method therefor has been disclosed in the first embodiment, so the present embodiment does not describe it again.

The following description discloses the method first in order to clearly describe the UV LED package structure 1000, but the UV LED package structure 1000 is not limited to being produced by the method. The method of the present embodiment includes steps S210 to S260. However, the steps S210 to S260 can be changed or replaced in a reasonable manner, and the sequence of the steps S210 to S260 can be adjusted according to practical needs. Moreover, the figures only show how to manufacture two UV LED package structures 1000 in order to clearly illustrate the method.

Figure 11:
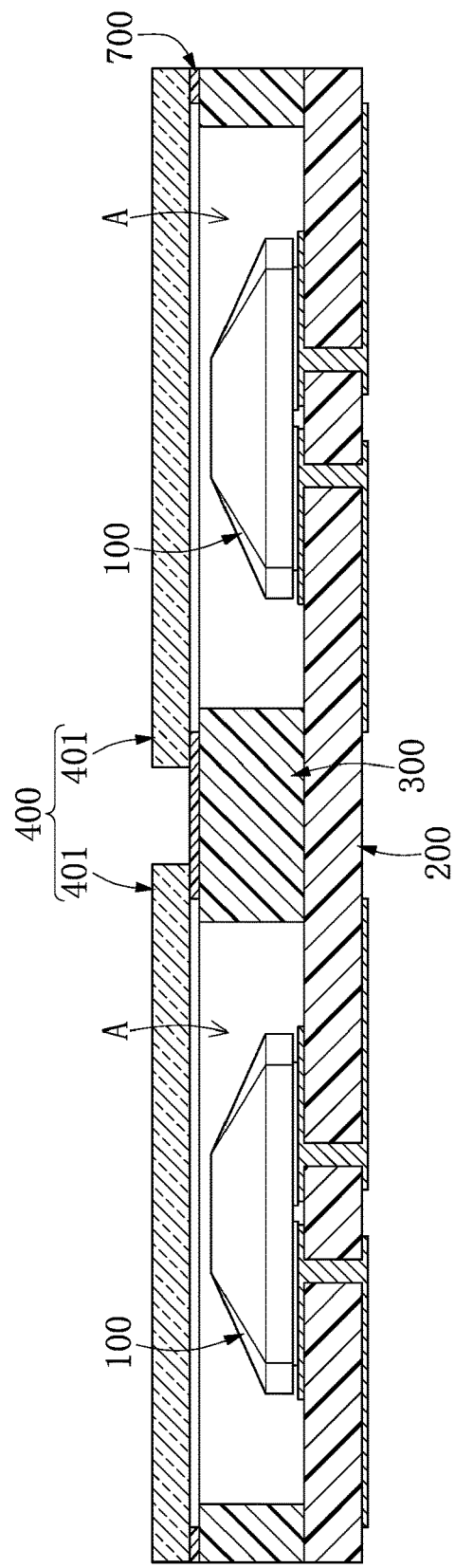
FIG. 11 is a cross-sectional view showing steps S210 to S230 of a method for manufacturing a UV LED package structure according to a second embodiment of the present disclosure.

As shown in FIG. 11, the step S210 is implemented by providing a substrate assembly 200 and a housing assembly 300 disposed on the substrate assembly 200. The substrate assembly 200 and the housing assembly 300 surroundingly co-define a plurality of accommodating spaces A.

As shown in FIG. 11, the step S220 is implemented by respectively arranging a plurality of UV light emitting units 100 in the accommodating spaces A and mounting the UV light emitting units 100 on the substrate assembly 200.

As shown in FIG. 11, the step S230 is implemented by fixing a plurality of translucent members 401 on the housing assembly 300 through an adhesive layer 700, so that the translucent members 401 respectively enclose the accommodating spaces A. The translucent member 401 is preferably a plate-like quartz glass or lens, but the present disclosure is not limited thereto. It should be noted that when the UV LED package structure 1000 is manufactured by implementing the method, any nitrogen or vacuum packaging machine does not need to be used because the enclosed accommodating space A can be filled with air (i.e., not vacuum packaging), so that the cost of packaging machine can be effectively reduced.

Figure 12:
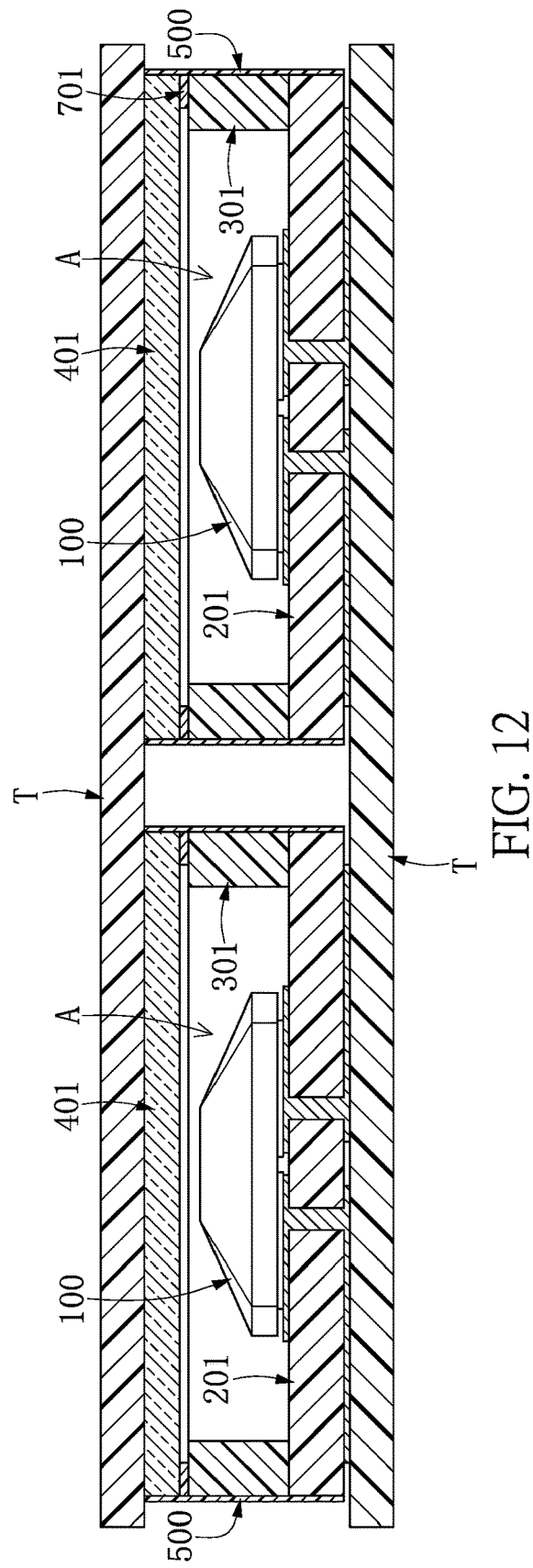
FIG. 12 is a cross-sectional view showing steps S240, S250, and a part of S260 of the method according to the second embodiment of the present disclosure.

As shown in FIG. 12, the step S240 is implemented by bonding the substrate assembly 200 on a releasing tape T. The releasing tape T in the present embodiment can be a thermal release tape, a heat-resistant tape, or a UV tape, but the present disclosure is not limited thereto.

As shown in FIG. 12, the step S250 is implemented by sawing the substrate assembly 200, the housing assembly 300, and the adhesive layer 700 to respectively form a plurality of substrates 201, a plurality of housings 301 respectively disposed on the substrates 201, and a plurality of adhesives 701 respectively disposed on the housings 301. In addition, another releasing tape T can be further disposed on the top sides of the translucent members 401 for assisting to form a water-resistant film 500 in the following steps.

Figure 13:
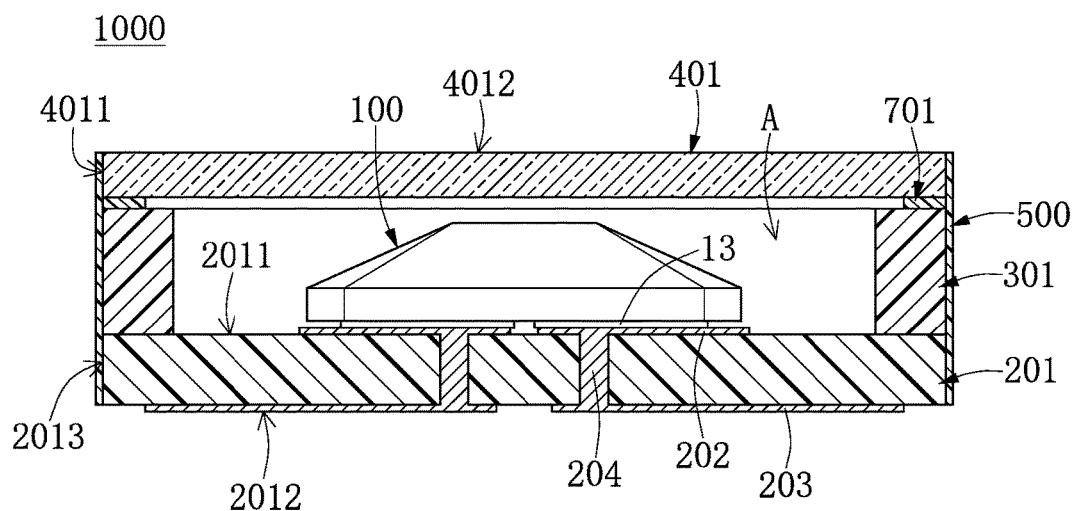
FIG. 13 is a cross-sectional view showing the other part of step S260 of the method according to the second embodiment of the present disclosure.

As shown in FIGS. 12 and 13, the step S260 is implemented by forming a water-resistant film 500 on peripheral side 2013 of the substrate 201, peripheral side of the housing 3011, peripheral side 4011 of the translucent member 401 to produce a UV LED package structure 1000, and then removing the releasing tapes T.

Figure 14:
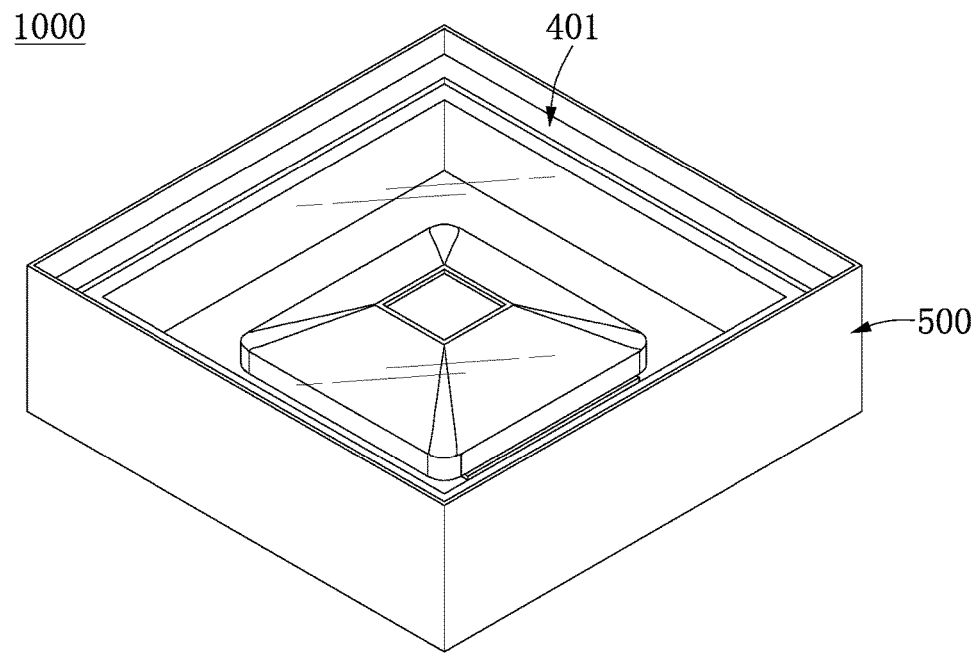
FIG. 14 is a perspective view showing the UV LED package structure according to the second embodiment of the present disclosure.
Figure 15:
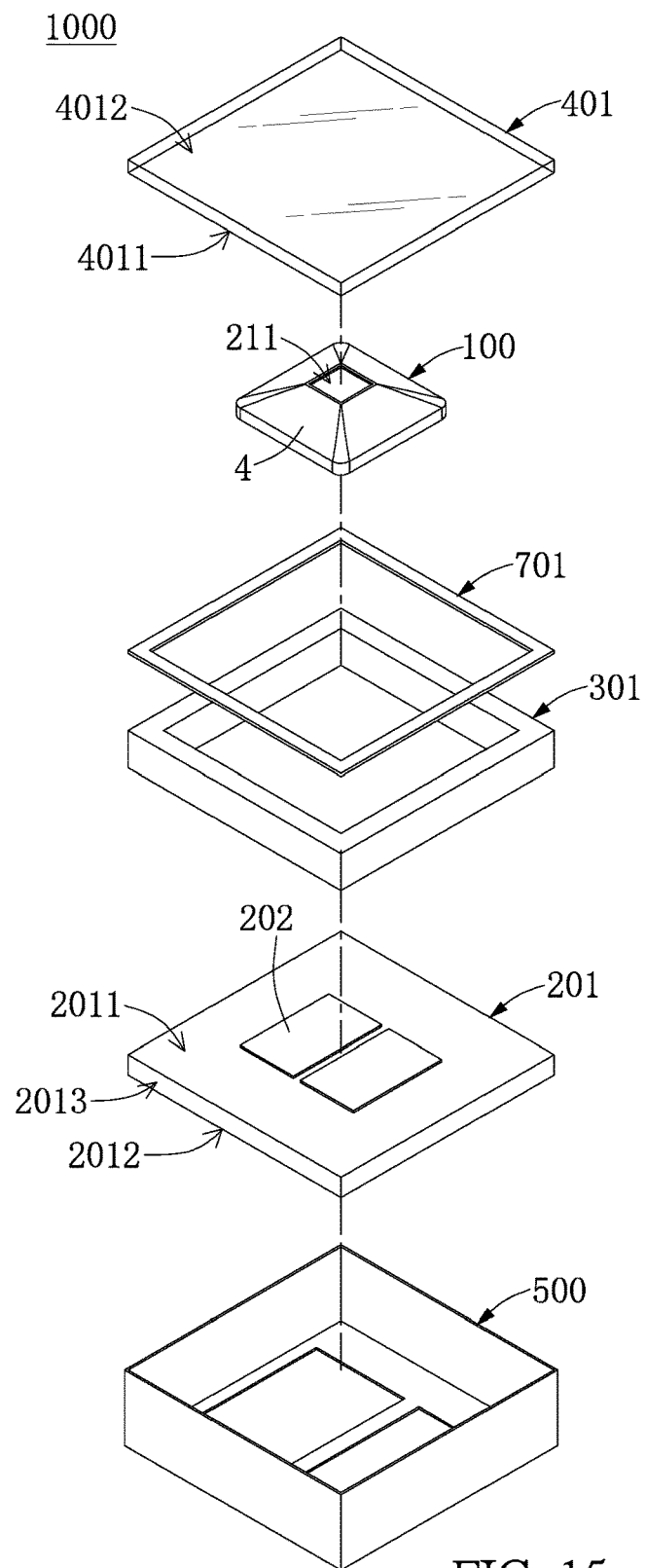
FIG. 15 is an exploded view of FIG. 14.

The method in the present embodiment has been disclosed in the above description, and the following description discloses the structure of the UV LED package structure 1000. As shown in FIGS. 13 to 15, the UV LED package structure 1000 includes the UV light emitting unit 100 as disclosed in the first embodiment, a substrate 201, a housing 301, a translucent member 401, and a water-resistant film 500.

The substrate 201 includes two metallic pads 202, two externally connecting pads 203, and two connecting pillars 204. The two metallic pads 202 are arranged on a top surface 2011 of the substrate 201, and the externally connecting pads 203 are arranged on a bottom surface 2012 of the substrate 201. The two connecting pillars 204 are embedded in the substrate 201. One ends of the two connecting pillars 204 are respectively connected to the two metallic pads 202, and the other ends of the two connecting pillars 204 are respectively connected to the two externally connecting pads 203, thereby establishing an electrical connection between the two metallic pads 202 and the two externally connecting pads 203.

Specifically, the UV light emitting unit 100 is mounted on the substrate 201. The soldering layer 13 of the UV light emitting unit 100 is fixed on the two metallic pads 202 of the substrate 201. The housing 301 is connected to the substrate 201 and around the UV light emitting unit 100, so that the UV light emitting unit 100 is arranged in an accommodating space A surroundingly defined by the housing 301 and the substrate 201.

Moreover, the translucent member 401 is fixed on the housing 301 by an adhesive 701 to enclose the accommodating space A, and the enclosed accommodating space A can be filled with air (not in vacuum). That is to say, the translucent member 401, the housing 301, and the substrate 201 surroundingly define an enclosed space (i.e., the enclosed accommodating space A) to accommodate the UV light emitting unit 100.

The water-resistant film 500 covers the peripheral side 2013 of the substrate 201, the peripheral side 3011 of the housing 301, and at least part of the peripheral side 4011 of the translucent member 401, thereby preventing any steam from invading into the enclosed accommodating space A. Specifically, a portion of the outer surface of the UV LED package structure 1000 in the present embodiment exposed from the water-resistant film 500 only includes the top surface 4012 of the translucent member 401 and the bottom surface 2012 of the substrate 201, but the present disclosure is not limited thereto. The water-resistant film 500 is made of fluoropolymer or an inorganic silicon dioxide film. In the present embodiment, the water-resistant film 500 is made of amorphous fluoropolymer having a plurality of peripheral functional groups of —CONH~Si(OR)n, but the present disclosure is not limited thereto.

Third Embodiment

Reference is made to FIGS. 16 to 21, which illustrate a third embodiment of the present disclosure. The present embodiment discloses a UV LED package structure 1000, which has the UV light emitting unit 100 disclosed in the first embodiment, and a method for manufacturing the UV LED package structure 1000. The description of the UV light emitting unit 100 and the method therefor has been disclosed in the first embodiment, so the present embodiment does not describe it again.

The following description discloses the method first in order to clearly explain the UV LED package structure 1000, but the UV LED package structure 1000 is not limited to being produced by the method. The method of the present embodiment includes steps S310 to S370. However, the steps S310 to S370 can be changed or replaced in a reasonable manner, and the sequence of the steps S310 to S370 can be adjusted according to practical needs. Moreover, the figures only show how to manufacture two UV LED package structures 1000 in order to clearly illustrate the method.

Figure 16:
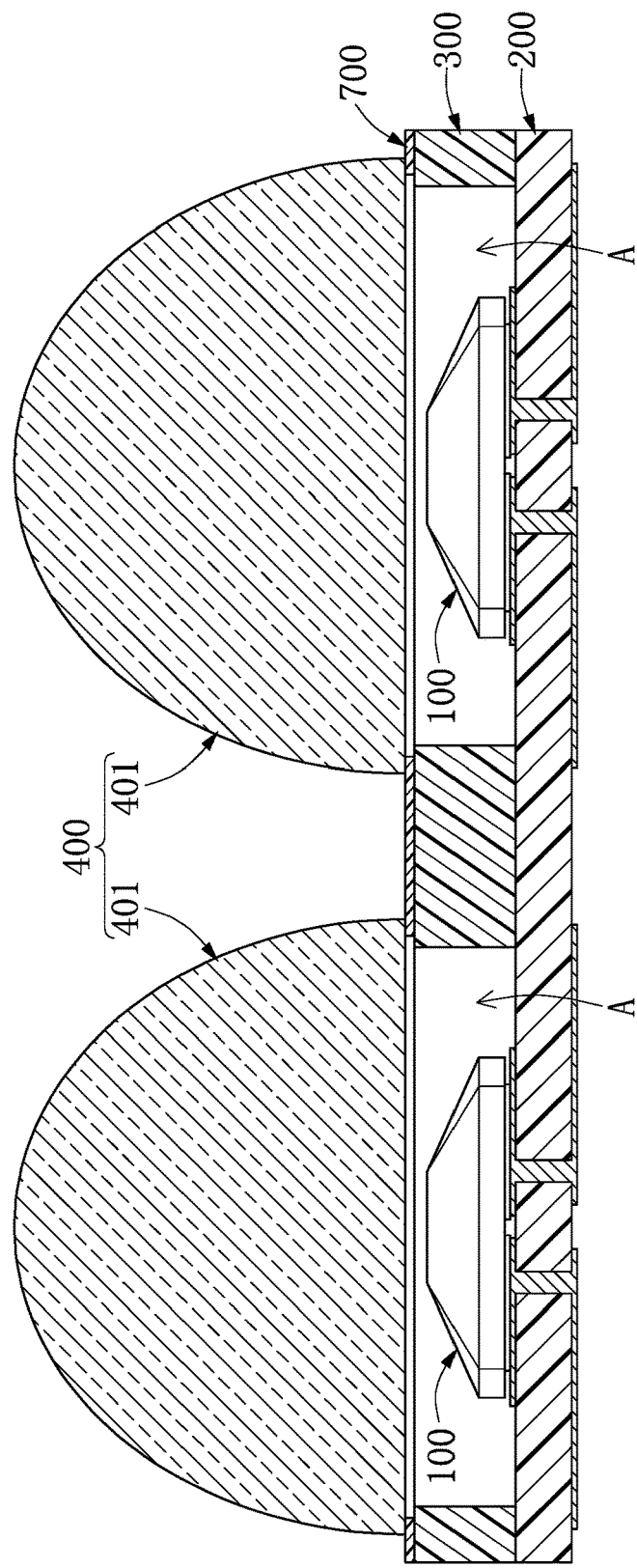
FIG. 16 is a cross-sectional view showing steps S310 to S330 of a method for manufacturing a UV LED package structure according to a third embodiment of the present disclosure.

As shown in FIG. 16, the step S310 is implemented by providing a substrate assembly 200 and a housing assembly 300 disposed on the substrate assembly 200. The substrate assembly 200 and the housing assembly 300 surroundingly co-define a plurality of accommodating spaces A.

As shown in FIG. 16, the step S320 is implemented by respectively arranging a plurality of UV light emitting units 100 in the accommodating spaces A and mounting the UV light emitting units 100 on the substrate assembly 200.

As shown in FIG. 16, the step S330 is implemented by fixing a translucent assembly 400 (i.e., a plurality of translucent members 401) on the housing assembly 300 by and adhesive layer 700, so that the translucent members 401 respectively enclose the accommodating spaces A. The translucent member 401 is preferably a convex lens, but the present disclosure is not limited thereto. It should be noted that when the UV LED package structure 1000 is manufactured by implementing the method, any nitrogen or vacuum packaging machine does not need to be used because the enclosed accommodating space A can be filled with air (not in vacuum), so that the cost of packaging machine can be effectively reduced.

Figure 17:
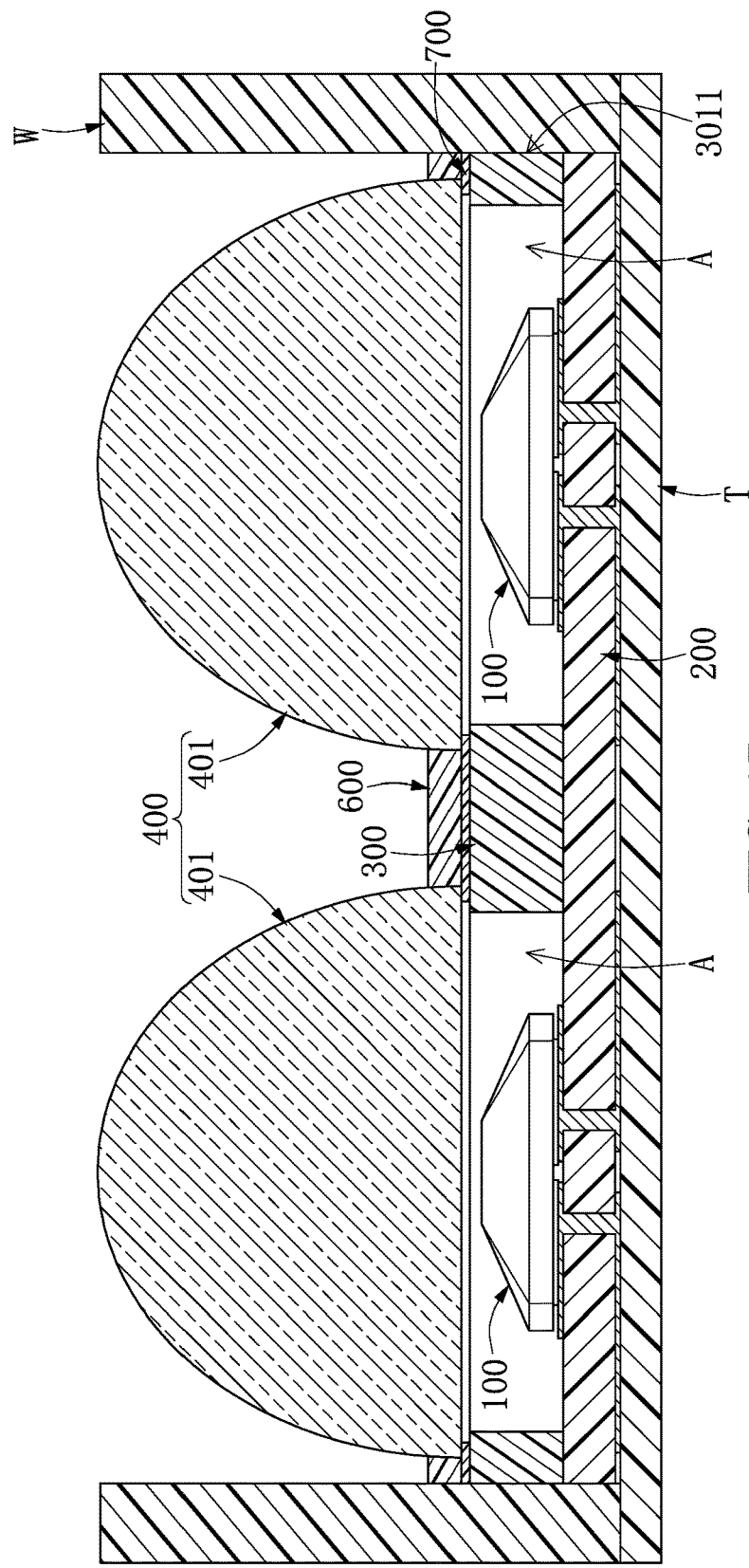
FIG. 17 is a cross-sectional view showing steps S340 and S350 of the method according to the third embodiment of the present disclosure.

As shown in FIG. 17, the step S340 is implemented by disposing the substrate assembly 200 on a releasing tape T and disposing a surrounding wall W on the releasing tape T. Specifically, the surrounding wall W is higher than the housing assembly 300, and the surrounding wall W is adhered on a peripheral side 3011 of the housing assembly 300. The releasing tape T in the present embodiment can be a thermal release tape, a heat resistant tape, or a UV tape, but the present disclosure is not limited thereto.

As shown in FIG. 17, the step S350 is implemented by forming a glue layer 600, which is made of PDMS, on the housing assembly 300 and around bottom portions of the translucent members 401. Specifically, the glue layer 600 is formed in a space surroundingly defined by the housing assembly 300, the translucent assembly 400, and the surrounding wall W.

Figure 18:
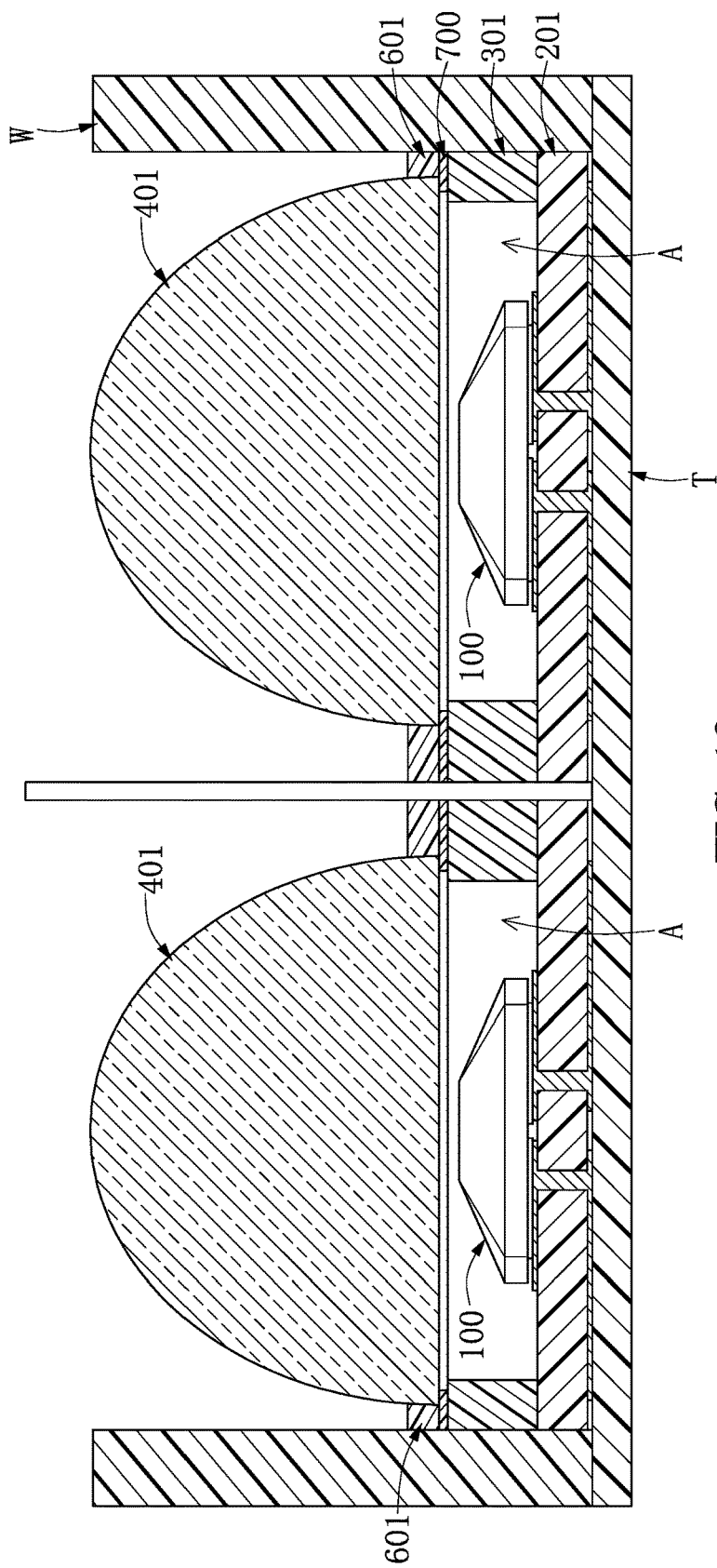
FIG. 18 is a cross-sectional view showing step S360 of the method according to the third embodiment of the present disclosure.

As shown in FIG. 18, the step S360 is implemented by sawing the substrate assembly 200, the housing assembly 300, the adhesive layer 700, and the glue layer 600 to respectively form a plurality of substrates 201, a plurality of housings 301 respectively disposed on the substrates 201, a plurality of adhesives 701 respectively disposed on the housings 301, and a plurality of glue bodies 601 respectively arranged around the translucent members 401.

Figure 19:
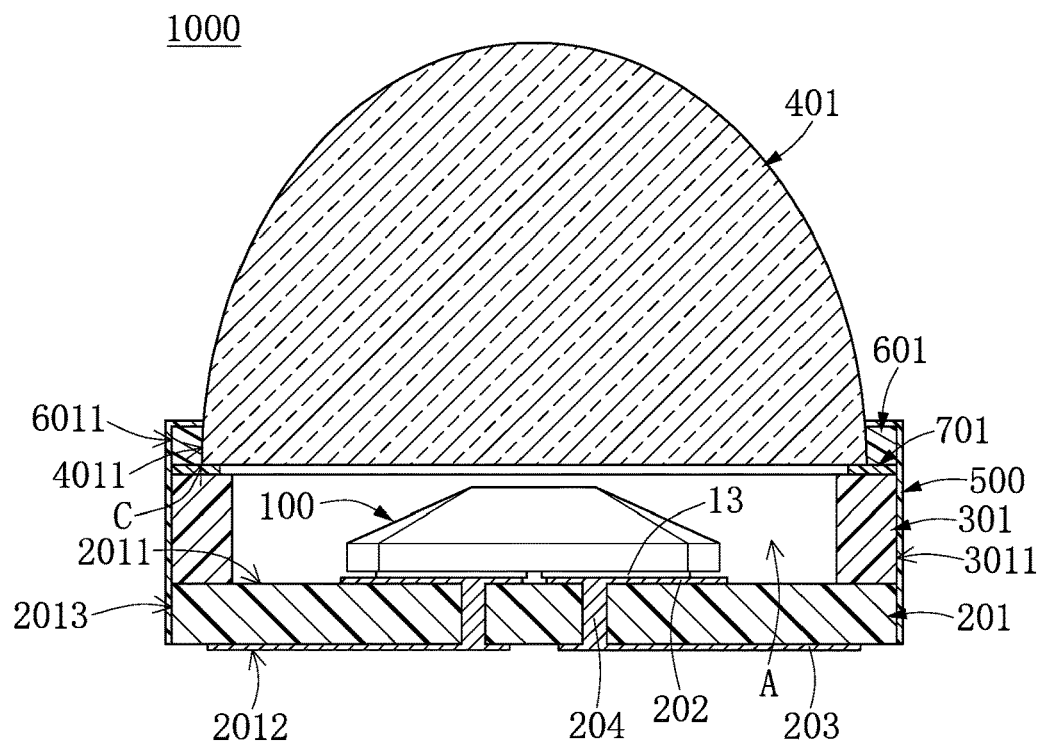
FIG. 19 is a cross-sectional view showing step S370 of the method according to the third embodiment of the present disclosure.

As shown in FIG. 19, the step S370 is implemented by forming a water-resistant film 500 on peripheral sides 2013, 3011, 4011, 6011 of each substrate 201, the corresponding housing 301, the corresponding translucent member 401, and the corresponding glue body 601 to produce a UV LED package structure 1000, and then removing the releasing tape T and the surrounding wall W.

Figure 20:
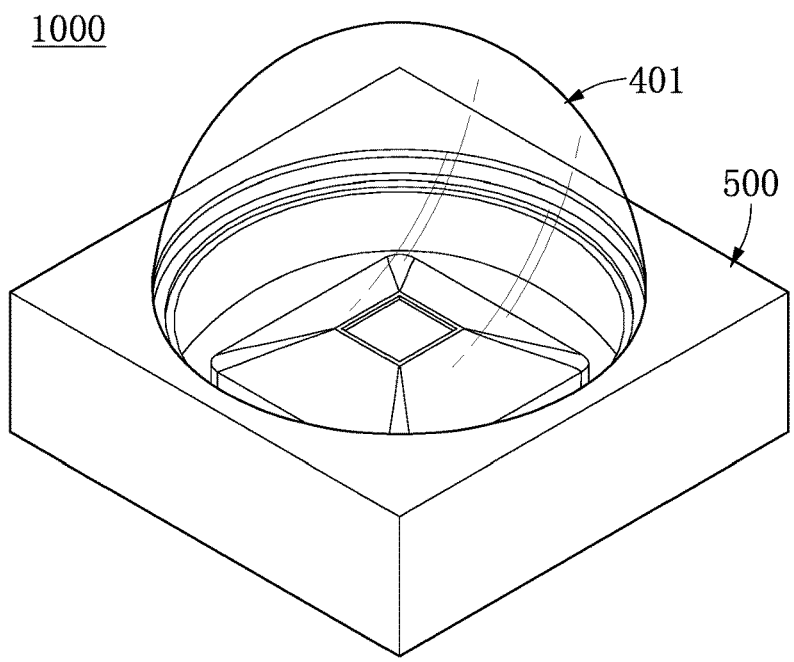
FIG. 20 is a perspective view showing the UV LED package structure according to the third embodiment of the present disclosure.
Figure 21:
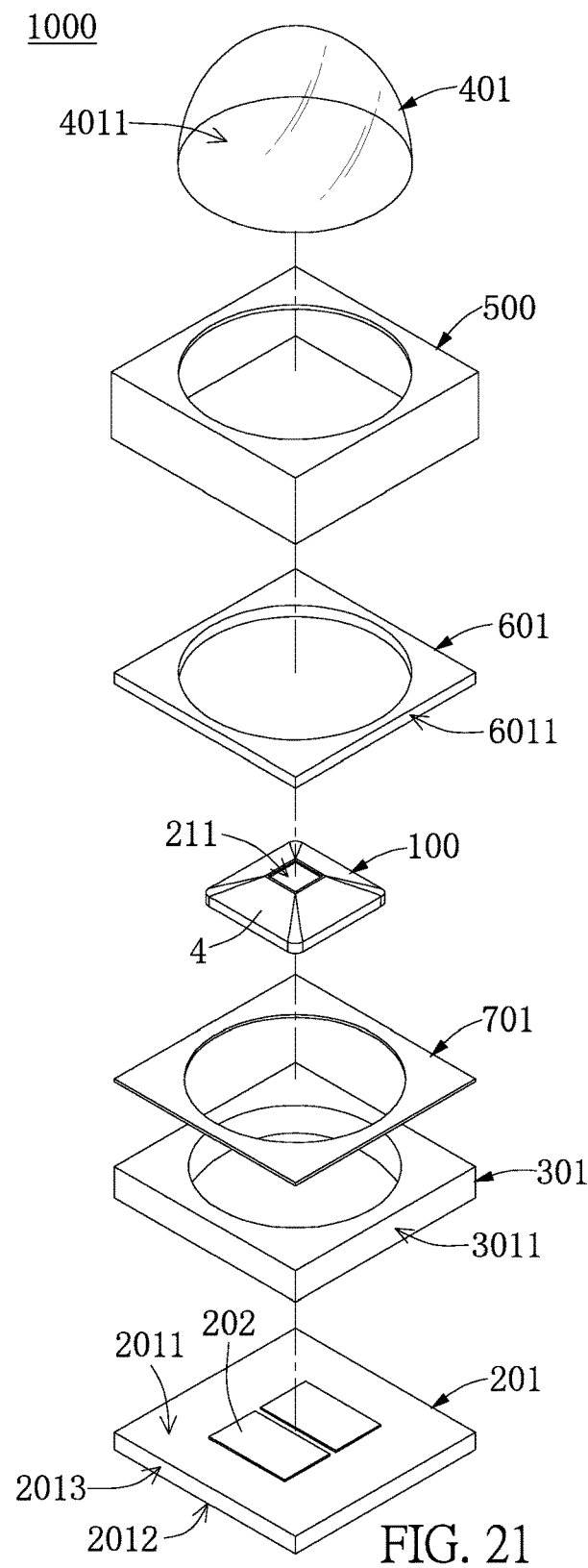
FIG. 21 is an exploded view of FIG. 20.

The method in the present embodiment has been disclosed in the above description, and the following description discloses the structure of the UV LED package structure 1000. As shown in FIGS. 19 to 21, the UV LED package structure 1000 includes the UV light emitting unit 100 as disclosed in the first embodiment, a substrate 201, a housing 301, a translucent member 401, a glue body 601, and a water-resistant film 500.

The substrate 201 includes two metallic pads 202 are arranged on a top surface 2011 thereof, two externally connecting pads 203 arranged on a bottom surface 2012 thereof, and two connecting pillars 204 embedded therein. One ends of the two connecting pillars 204 are respectively connected to the two metallic pads 202, and the other ends of the two connecting pillars 204 are respectively connected to the two externally connecting pads 203, thereby establishing an electrical connection between the two metallic pads 202 and the two externally connecting pads 203.

Specifically, the UV light emitting unit 100 is mounted on the substrate 201. The soldering layer 13 of the UV light emitting unit 100 is fixed on the two metallic pads 202 of the substrate 201. The housing 301 is connected to the substrate 201 and around the UV light emitting unit 100, so that the UV light emitting unit 100 is arranged in an accommodating space A surroundingly defined by the housing 301 and the substrate 201.

Moreover, the translucent member 401 is fixed on the housing 301 by an adhesive 701 to enclose the accommodating space A, and the enclosed accommodating space A can be filled with air (not in vacuum). That is to say, the translucent member 401, the housing 301, and the substrate 201 surroundingly co-define an enclosed space (i.e., the enclosed accommodating space A) to accommodate the UV light emitting unit 100. The glue body 601 is made of PDMS, and the glue body 601 is disposed on a ring-shaped external corner C defined by the housing 301 and the translucent member 401, so that the glue body 601 is configured to enhance the connection between the housing 301 and the translucent member 401.

The water-resistant film 500 covers the peripheral side 2013 of the substrate 201, the peripheral side 3011 of the housing 301, the peripheral side 6011 of the glue body 601, and at least part of the peripheral side 4011 of the translucent member 401, thereby preventing any steam from invading into the enclosed accommodating space A. Specifically, a portion of the outer surface of the UV LED package structure 1000 in the present embodiment exposed from the water-resistant film 500 only includes the translucent member 401 and the bottom surface 2012 of the substrate 201, but the present disclosure is not limited thereto. The water-resistant film 500 is made of fluoropolymer or an inorganic silicon dioxide film. In the present embodiment, the water-resistant film 500 is made of amorphous fluoropolymer having a plurality of peripheral functional groups of —CONH~Si(OR)n, but the present disclosure is not limited thereto.

[The Possible Effects of the Present Disclosure]

In summary, the UV LED package structure, the UV light emitting unit, and the method for manufacturing a UV light emitting unit in the present embodiments each adapts the side lens made of fluoropolymer or PDMS, so that the light efficiency of the UV light emitting unit can be effectively increased. Moreover, the steam permeability of the water-resistant layer is less than that of the side lens, the steam permeability of the side lens divided by that of the water-resistant layer is more than 10, and the water-resistant layer made of fluoropolymer or an inorganic silicon dioxide film is formed on the outer surface of the side lens, thereby effectively preventing any steam from invading into the UV LED chip. In addition, the UV LED chip in the present disclosure has a bat-wing shaped light pattern, and the UV LED chip is cooperated with the side lens to change the light pattern from the bat-wing shape to the Lambertian shape, thereby increasing the light efficiency.

Specifically, the shape of the outer surface of the side lens can be adjusted according to designer's needs (e.g., light efficiency and light emitting angle), thereby satisfying different requests. Moreover, when the UV light emitting unit is applied to a method for manufacturing a UV LED package structure (i.e., the steps S230 and S330), any nitrogen or vacuum packaging machine does not need to be used due to the UV light emitting unit has the water-resistant layer, so that the cost of packaging machine can be effectively reduced.

The descriptions illustrated supra set forth simply the preferred embodiments of the present disclosure; however, the characteristics of the present disclosure are by no means restricted thereto. All changes, alterations, or modifications conveniently considered by those skilled in the art are deemed to be encompassed within the scope of the present disclosure delineated by the following claims.

What is claimed is:

1. A UV light emitting unit, comprising:
   a carrier;
   a UV LED chip mounted on the carrier, wherein the UV LED chip has a top surface and a surrounding side surface arranged adjacent to the top surface, and the top surface has a central region and an external region arranged around the central region and the external region connected to the surrounding side surface;
   a side lens disposed on the carrier and covering the surrounding side surface of the UV LED chip; and
   a water-resistant layer covering an outer surface of the side lens and the external region of the top surface of the UV LED chip;
   wherein a steam permeability of the water-resistant layer is less than that of the side lens, and the steam permeability of the side lens divided by that of the water-resistant layer is more than 10.

2. The UV light emitting unit as claimed in claim 1, wherein the carrier has a first surface and a second surface opposite to the first surface, a bottom edge of the outer surface of the side lens is connected to a peripheral edge of the first surface, and the UV light emitting unit includes:
   an electrode layer arranged on the first surface of the carrier, wherein the UV LED chip is electrically connected to the electrode layer;
   a soldering layer arranged on the second surface of the carrier;
   a plurality of conductive pillars embedded in the carrier, wherein two opposite ends of each of the conductive pillars are respectively connected to the electrode layer and the soldering layer; and
   a reflective layer arranged on the first surface of the carrier and disposed around the electrode layer, wherein the reflective layer is embedded in the side lens.

3. The UV light emitting unit as claimed in claim 1, wherein the UV LED chip includes a plurality of AlxGa1−xN films disposed on a sapphire substrate thereof, and x>0.2, the UV LED chip is configured to emit light having a wavelength less than 324 nm, and the UV LED chip is configured to have a bat-wing shaped light pattern.

4. The UV light emitting unit as claimed in claim 1, wherein the outer surface of the side lens includes a plurality of flat surfaces, top edges of the flat surfaces are connected to a peripheral edge of the top surface of the UV LED chip, and bottom edges of the flat surfaces are connected to a peripheral edge of the carrier.

5. The UV light emitting unit as claimed in claim 1, wherein the outer surface of the side lens includes a plurality of concave surfaces, top edges of the concave surfaces are connected to a peripheral edge of the top surface of the UV LED chip, and bottom edges of the concave surfaces are connected to a periphery edge of the carrier.

6. The UV light emitting unit as claimed in claim 1, wherein the outer surface of the side lens includes a plurality of convex surfaces, top edges of the convex surfaces are connected to a peripheral edge of the top surface of the UV LED chip, and bottom edges of the convex surfaces are connected to a periphery edge of the carrier.

7. The UV light emitting unit as claimed in claim 1, wherein the water-resistant layer covers a peripheral side of the carrier.

8. The UV light emitting unit as claimed in claim 1, wherein the water-resistant layer is made of amorphous fluoropolymer having a plurality of peripheral functional groups of —CONH~Si(OR)n.

9. The UV light emitting unit as claimed in claim 1, wherein the side lens is made of fluoropolymer or PDMS, the water-resistant layer is made of fluoropolymer or an inorganic silicon dioxide film, and the water-resistant layer further covers a peripheral side of the carrier.

10. A UV LED package structure, comprising:
    a substrate;
    a UV light emitting unit mounted on the substrate and including:
       a carrier;
       a UV LED chip mounted on the carrier, wherein the UV LED chip has a top surface and a surrounding side surface connected to the top surface, and the top surface has a central region and an external region arranged around the central region and the external region connected to the surrounding side surface;
       a side lens disposed on the carrier and covers the surrounding side surface of the UV LED chip so as to form an outer surface; and
       a water-resistant layer covering the outer surface of the side lens and the external region of the top surface of the UV LED chip, wherein a steam permeability of the water-resistant layer is less than that of the side lens, and the steam permeability of the side lens divided by that of the water-resistant layer is more than 10;
    a housing connected to the substrate and arranged around the UV light emitting unit; and
    a translucent member fixed on the housing and located above the UV light emitting unit, an accommodating space defined by the translucent member, the housing, and the substrate, the accommodating space provided for accommodating the UV light emitting unit.

11. The UV LED package structure as claimed in claim 10, wherein the side lens is made of fluoropolymer or PDMS.

12. The UV LED package structure as claimed in claim 10, wherein the water-resistant layer is made of fluoropolymer or an inorganic silicon dioxide film.

13. The UV LED package structure as claimed in claim 10, wherein the translucent member and the housing are cooperated to form with a ring-shaped external corner.

14. The UV LED package structure as claimed in claim 13, further comprising a glue body made of PDMS, wherein the glue body is disposed on the external corner.

15. The UV LED package structure as claimed in claim 10, further comprising a water-resistant film, wherein the water-resistant film covers a peripheral side of the substrate, a peripheral side of the housing, and at least part of a peripheral side of the translucent member.

16. The UV LED package structure as claimed in claim 15, wherein the water-resistant film covers a peripheral side of the glue body.

17. A method for manufacturing a UV light emitting unit, comprising:
   mounting a UV LED chip on a carrier;
   disposing a protective sheet onto a central region of a top surface of the UV LED chip;
   forming a side lens on the carrier to cover a surrounding side surface of the UV LED chip;
   forming a water-resistant layer on the side lens to cover an outer surface of the side lens, an external region of the top surface of the UV LED chip, and the protective sheet; and
   removing the protective sheet, thereby forming the UV light emitting unit.

* * * * *